(12) United States Patent
Li

(10) Patent No.: US 10,062,740 B2
(45) Date of Patent: Aug. 28, 2018

(54) DISPLAY DEVICE WITH A BUFFER LAYER FILLED WITH BUBBLES AND PACKAGING METHOD

(71) Applicants: Shanghai Tianma AM-OLED Co., Ltd, Shanghai (CN); Tianma Micro-electronics Co., Ltd., Shenzhen (CN)

(72) Inventor: Yujun Li, Shanghai (CN)

(73) Assignees: Shanghai Tianma AM-OLED Co., Ltd., Shanghai (CN); Tianma Micro-electronics Co., Ltd., Shenzhen (CN)

( * ) Notice: Subject to any disclaimer, the term of this patent is extended or adjusted under 35 U.S.C. 154(b) by 0 days.

(21) Appl. No.: 15/219,014

(22) Filed: Jul. 25, 2016

(65) Prior Publication Data
US 2017/0309689 A1    Oct. 26, 2017

(30) Foreign Application Priority Data
Apr. 21, 2016 (CN) .......................... 2016 1 0251747

(51) Int. Cl.
| H01L 21/32 | (2006.01) |
| H01L 27/32 | (2006.01) |
| G02F 1/1333 | (2006.01) |
| H01L 51/52 | (2006.01) |
| H01L 51/56 | (2006.01) |

(52) U.S. Cl.
CPC .... *H01L 27/3244* (2013.01); *G02F 1/133308* (2013.01); *H01L 51/5281* (2013.01); *H01L 51/56* (2013.01); *G02F 2001/133331* (2013.01); *G02F 2201/503* (2013.01); *G02F 2202/28* (2013.01)

(58) Field of Classification Search
None
See application file for complete search history.

(56) References Cited

U.S. PATENT DOCUMENTS

| 2006/0077139 A1* | 4/2006 | Kwon | ..................... G09G 3/325 345/76 |
| 2008/0026200 A1* | 1/2008 | Kim | ........................ B29C 33/42 428/304.4 |
| 2009/0137771 A1* | 5/2009 | Moriyama | ........... A61K 6/0023 528/380 |
| 2009/0283211 A1* | 11/2009 | Matsuhira | ........... B29C 66/1122 156/275.7 |

(Continued)

FOREIGN PATENT DOCUMENTS

| CN | 101077610 A | 11/2007 |
| CN | 101317205 A | 12/2008 |

(Continued)

*Primary Examiner* — Lex Malsawma
(74) *Attorney, Agent, or Firm* — ANOVA LAW GROUP, PLLC

(57) ABSTRACT

A display device and a display device packing method are provided. The display device comprises a display panel having a display region and a non-display region; a cover lens disposed on a light-emitting surface of the display panel; and a buffer layer disposed between the cover lens and the display panel and in the non-display region of the display panel, wherein the buffer layer is selectively filled with a plurality of bubbles to enhance a buffering effect.

20 Claims, 5 Drawing Sheets

(56) References Cited

U.S. PATENT DOCUMENTS

| | | | |
|---|---|---|---|
| 2010/0033667 A1 | 2/2010 | Huang | |
| 2012/0201971 A1* | 8/2012 | Ryu | G02F 1/133308 427/535 |
| 2012/0287026 A1* | 11/2012 | Masuda | H01L 51/5246 345/76 |
| 2013/0187144 A1* | 7/2013 | Briers | C08L 63/00 257/40 |
| 2013/0214656 A1* | 8/2013 | Huang | H05K 5/061 312/223.1 |
| 2015/0092122 A1* | 4/2015 | Youn | G06F 1/1637 349/12 |

FOREIGN PATENT DOCUMENTS

| | | |
|---|---|---|
| CN | 101487942 A | 7/2009 |
| CN | 103031105 A | 4/2013 |
| CN | 103887446 A | 6/2014 |
| CN | 103982868 A | 8/2014 |
| CN | 104516577 A | 4/2015 |
| CN | 104571671 A | 4/2015 |
| CN | 105093633 A | 11/2015 |
| JP | H02156220 A | 6/1990 |
| JP | 2001091926 A | 4/2001 |

\* cited by examiner

US 10,062,740 B2

DISPLAY DEVICE WITH A BUFFER LAYER FILLED WITH BUBBLES AND PACKAGING METHOD

CROSS-REFERENCES TO RELATED APPLICATIONS

This application claims priority of Chinese Patent Application No. 201610251747.3, filed on Apr. 21, 2016, the entire contents of which are hereby incorporated by reference.

FIELD OF THE INVENTION

The present disclosure generally relates to the field of display technology and, more particularly, relates to a display device and packaging method thereof.

BACKGROUND

In recent years, flat panel displays have been widely used in a variety of fields because of their light weight and high energy efficiency, liquid crystal displays (LCDs) and organic light-emitting diode (OLED) displays are the most common among them. As technology advances, LCDs and OLEDs are developing towards light weight, thin thickness and compactness. LCDs and OLEDs featured with wide viewing angle, low power consumption, small size, and zero radiation allow users to enjoy desired visual experience.

Liquid optically clear adhesive (LOCA) is often adopted to attach a cover lens or cover glass to a display panel in OLEDs and LTPS-LCD (low temperature poly-silicon-LCD). LOCA has various advantages, such as high optical transmittance, good yellow resistance, low cost, good uniformity, and high yield. However, in existing display screens, cracks can easily occur at edges of the screen, the shock resistance and drop resistance is poor, and most display screens may only stand an impact energy up to 0.04 joules while a common requirement is about 0.08 joules. In particular, 80% of the cracks may occur in the cover lens, which may become even severer in the cover lens with a thickness less than 0.3 mm after a thinning process. The cracks may likely extend to a display region of the screen, degrading the reliability and image performance of the display panels.

Further, LCDs are often provided with a backlight module, whose frame adhesive exhibits a buffet function and some kind of protection to an external force, while OLEDs emit light by themselves without any backlight modules. Thus, when being subjected to an external force, OLEDs may be more severely affected.

The disclosed display device and packaging method thereof are directed to solve one or more problems set forth above and other problems.

BRIEF SUMMARY OF THE DISCLOSURE

One aspect of the present disclosure provides a display device. The display device comprises a display panel having a display region and a non-display region; a cover lens disposed on a light-emitting surface of the display panel; and a buffer layer disposed between the cover lens and the display panel and in the non-display region of the display panel, wherein the buffer layer is selectively filled with a plurality of bubbles to enhance a buffering effect.

Another aspect of the present disclosure provides a display device packaging method. The display device packaging method comprises forming a buffer layer on a non-display region of a display panel; coating a liquid optically clear adhesive layer on a display region of the display panel; and covering the cover lens on the buffer layer and the liquid optically clear adhesive layer and ultraviolet (UV) curing, wherein the buffer layer is selectively filled with a plurality of bubbles to enhance a buffering effect.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

The present disclosure provides an improved display device and an improved packaging method thereof. The mechanical shock resistance and drop resistance of the display device may be improved, and the reliability and image performance may be improved accordingly.

Figure 1A:
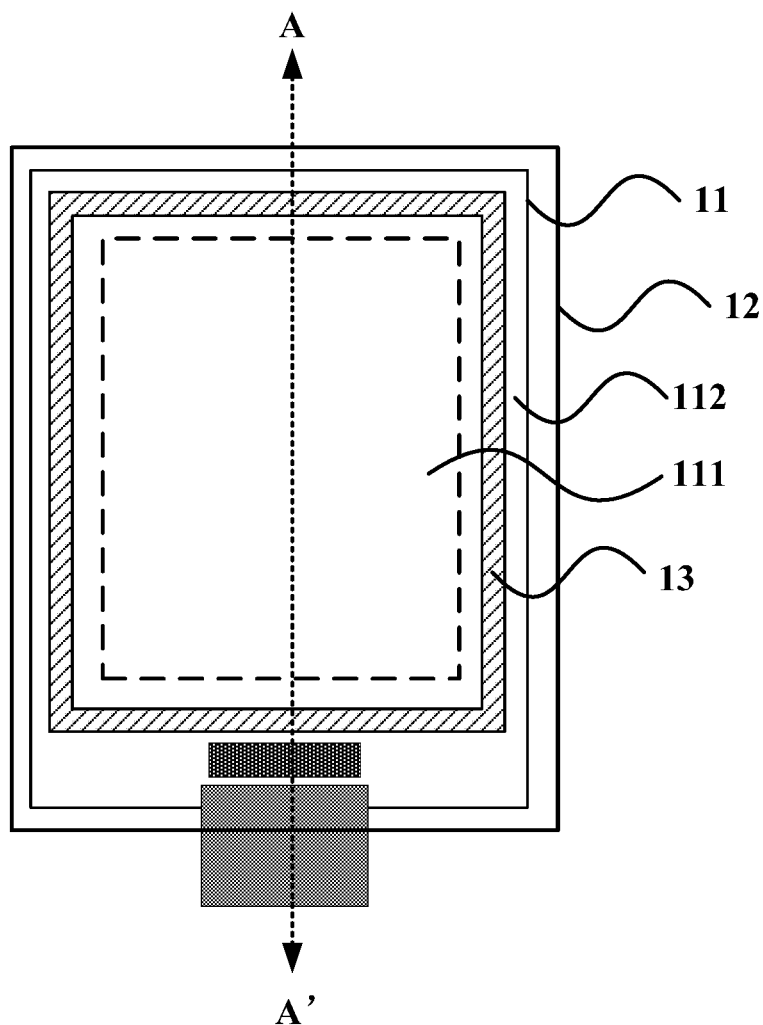
FIG. 1a illustrates a top view of an exemplary display device consistent with disclosed embodiments.
Figure 1B:
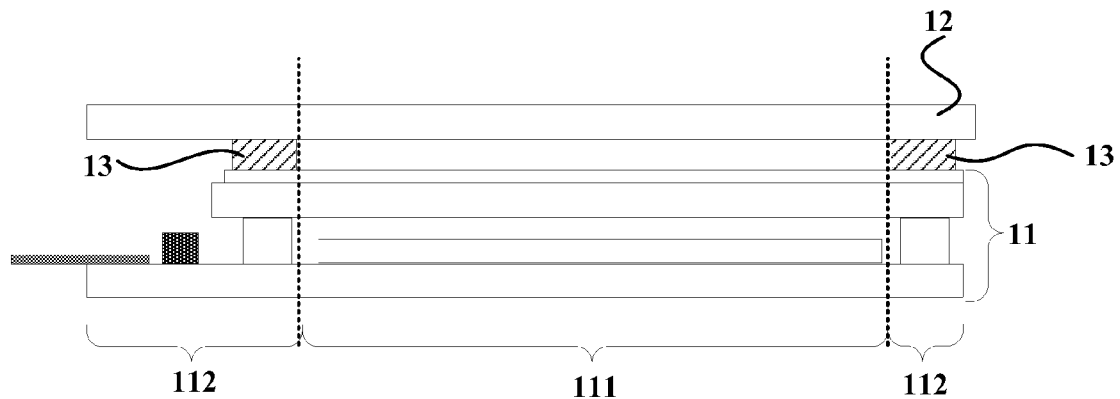
FIG. 1b illustrates an AA' cross-sectional view of an exemplary display device in FIG. 1a consistent with disclosed embodiments.

FIG. 1a illustrates a top view of an exemplary display device consistent with disclosed embodiments. FIG. 1b illustrates an AA' cross-sectional view of an exemplary display device in FIG. 1a consistent with disclosed embodiments.

As shown in FIG. 1a and FIG. 1b, the display device may include a display panel 11, a cover lens or a cover glass 12 and a buffer layer 13. In particular, the cover lens 12 may be disposed on a light-emitting surface of the display panel 11, for example, a surface of the display panel 11 facing viewers. The cover lens 12 may be made of transparent rigid or flexible materials, such as transparent glass, or transparent plastic.

The display panel 11 may include a display region 111 and a non-display region 112. For example, the display region 111 may be in a center region of the display panel 11, the non-display region 112 may be in a border region or edges of the display panel 21, and the non-display region 112 may surround the display region 111. The display panel 11 may be any appropriate type of display panels capable of displaying videos and/or images, such as plasma display panel (PDP), field emission display (FED) panel, liquid crystal display (LCD) panel, organic light-emitting diode (OLED) display panel, light-emitting diode (LED) display panel, quantum dots (QDs) display panel, electrophoretic display panels (i.e., e-readers) or other types of display panels.

The corresponding display device may also be any appropriate type of display devices including the disclosed display panels. In the disclosed embodiments, the display panel may be an OLED display panel or an LCD panel, and the corresponding display device may be an OLED display device or an LCD device.

The buffer layer 13 may be disposed between the cover lens 12 and the display panel 11 and disposed in the non-display region 112 of the display panel 11. For example, the buffer layer 13 may also surround the display region 111 of the display panel 11. When the display device is subjected to an external force, the buffer layer 13 may be able to absorb external impact or vibration energy through a deformation, such as compression. Thus, the entire display device may be protected, screen crack caused by the external force may be suppressed, and the shock resistance of the display device may be improved accordingly.

It should be noted that, the shape of the display region 111 of the display panel 11 and the shape of the buffer layer 13 may vary according to different application scenarios. In one embodiment, as shown in FIG. 1a, the display region 111 may have a rectangular shape, and the buffer layer 13 may have a rectangular frame shape. In certain embodiment, the display region 111 may have a circular shape, a square shape, a diamond shape, or even an irregular frame shape, and the buffer layer 13 may have a circular frame shape, a diamond frame shape, a square frame shape, or even an irregular frame shape.

Figure 2:
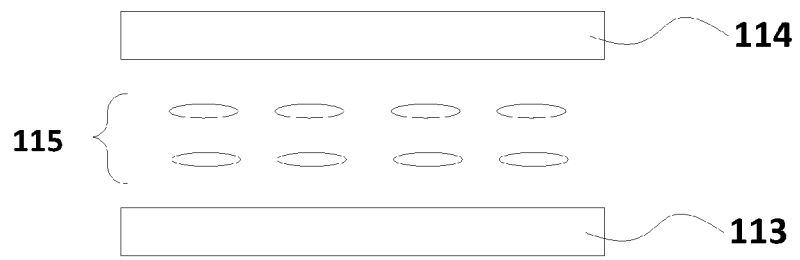
FIG. 2 illustrates a cross-sectional view of an exemplary display panel consistent with disclosed embodiments.

FIG. 2 illustrates a cross-sectional view of an exemplary display panel consistent with disclosed embodiments. As shown in FIG. 2, the display panel 11 may include a first substrate 113, a second substrate 114 arranged opposite to the first substrate 113, and a liquid crystal layer sandwiched between the first substrate 113 and the second substrate 114. That is, the display panel 11 may be an LCD panel. The second substrate 114 may be a color film substrate, and the first substrate 113 may be an array substrate. The LCD panel is often provided with a backlight module, whose frame adhesive may exhibit a buffer function and some kind of protection to an external force.

In another embodiment, the display panel may be an OLED display panel. The OLED display panel emits light by itself without any backlight module. Thus, when being subjected to an external force, the OLED display panel may be more severely affected. It should be noted that, the OLED display panel may be a passive-matrix (PMOLED) display panel or an active-matrix (AMOLED) display panel according to the panel structure, or may be a top-emission OLED display panel or a bottom-emission OLED display panel according to the direction that emitted light exits the panel. Further, the OLED display panel may be any appropriate type of OLED display panels.

Figure 3:
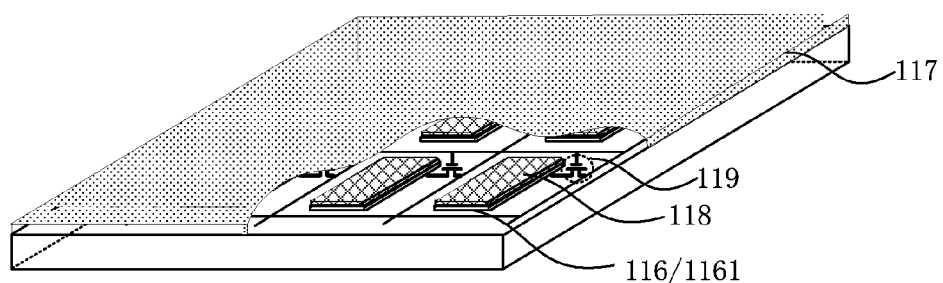
FIG. 3 illustrates a schematic diagram of another exemplary display panel consistent with disclosed embodiments.

FIG. 3 illustrates a schematic diagram of another exemplary display panel consistent with disclosed embodiments. As shown in FIG. 3, the display panel may be an AMOLED display panel. The display panel may include a first electrode layer 116, a second electrode layer 117, a light-emitting functional layer 118 sandwiched between the first electrode layer 116 and the second electrode layer 117, and a plurality of transistors 119 arranged in a matrix.

The first electrode layer 116 may include a plurality of first sub-electrodes 1161 arranged in a matrix, and each first sub-electrode 1161 may be electrically connected to one transistor 119 driving the first sub-electrode 1161. The second electrode layer 117 may be a planar electrode. It should be noted that, the number and shape of the first sub-electrodes 1161 shown in FIG. 3 are only for illustrative purposes, and are not intended to limit the scope of the present disclosure.

Figure 4:
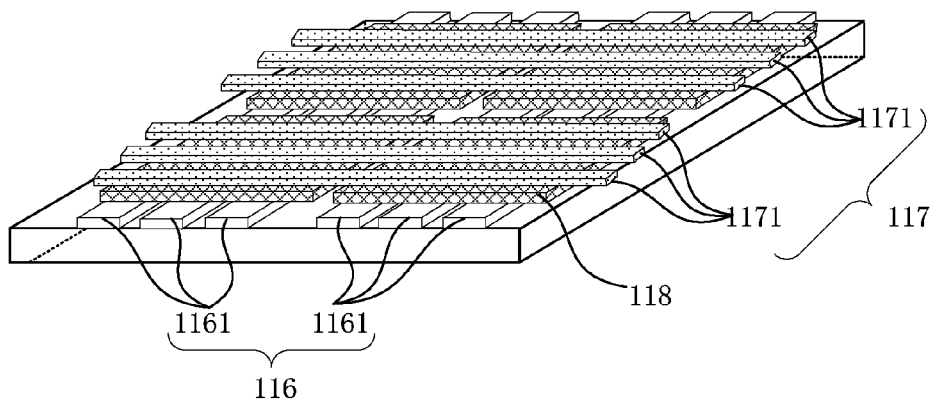
FIG. 4 illustrates a schematic diagram of another exemplary display panel consistent with disclosed embodiments.

FIG. 4 illustrates a schematic diagram of another exemplary display panel consistent with disclosed embodiments. As shown in FIG. 4, the display panel may be an PMOLED display panel. Similar to the AMOLED display panel shown in FIG. 3, the PMOLED display panel may also include a first electrode layer 116, a second electrode layer 117, and a light-emitting functional layer 118 sandwiched between the first electrode layer 116 and the second electrode layer 117.

However, in the PMOLED display panel, the first electrode layer 116 may include a plurality of first sub-electrodes 1161 arranged in parallel, and the second electrode layer 117 may include a plurality of second sub-electrodes 1171 arranged in parallel. The first sub-electrodes 1161 may intersect or cross the second sub-electrodes 1171, but may be electrically insulated from the second sub-electrodes 1171. It should be noted that, the number and shape of the first sub-electrodes 1161 and the second sub-electrodes 1171 shown in FIG. 4 are only for illustrative purposes, and are not intended to limit the scope of the present disclosure.

Both the AMOLED display panel shown in FIG. 3 and the PMOLED display panel shown in FIG. 4 may have a structure shown in FIGS. 1a-1b. That is, the buffer layer may be disposed between the cover lens and the display panel, and within the non-display region of the display panel. In particular, bubbles may be disposed inside the buffer layer. The buffer layer with the bubbles disposed inside may provide a better and more effective buffering effect when the display panel is subjected to an external mechanical impact force or shock. Thus, the strength of the display device may be improved. For example, the display panel may be able to stand an impact energy up to approximately 0.08 joules, which is highly desired by most customers. Further, the bubbles may be filled with air, nitrogen or inert gas. The inert gas, such as helium, argon, may minimize the oxidation of the buffer layer caused by a long time use.

In one embodiment, all the bubbles may be filled with a same gas, for example, air, nitrogen or inert gas. In another embodiment, the bubbles may be filled with different gases. For example, some bubbles may be filled with air, some bubbles filled with nitrogen, and the remained bubbles may be filled inert gas. In another embodiment, the bubbles may be filled with more than one of air, nitrogen and inert gas. For example, the bubbles may be filled with a combination of air and inert gas.

The material of the buffer layer may include elastic silicone, rubber or resin. UV curable adhesive or liquid optically clear adhesive (LOCA) may also be adopted as the buffer layer, in which the bubbles may also be disposed. In an existing packaging process of the display panel, the cover lens and the display panel are often attached to each other by the liquid optically clear adhesive, and a corresponding adhesive frame formed by the liquid optically clear may be sealed by the UV curable adhesive. In the disclosed embodiments, the materials of the buffer layer may be the same as the materials used in the existing packaging process of the display panel. Thus, new materials may not be introduced to the existing packaging process to fabricate the buffer layer, and the complexity and the cost of the packaging process may be reduced accordingly.

When the UV curable adhesive or liquid optically clear adhesive is adopted to fabricate the buffer layer, the UV curable adhesive or liquid optically clear adhesive may be continuously stirred for certain time to generate the bubbles. Choosing different preparing environment settings, the generated bubbles may be filled with different gases. For example, given a nitrogen atmosphere, a large number of the bubbles may be formed inside the UV curable adhesive or liquid optically clear adhesive after being continuously stirred for certain time. Then the UV curable adhesive or liquid optically clear adhesive may be coated on the display panel to form the buffer layer, and accordingly the gas filled in the bubbles inside the buffer layer may be nitrogen.

The stirring time of the UV curable adhesive or liquid optically clear adhesive may be adjusted according to various application scenarios. For example, longer stirring time may lead to a larger density of the bubbles inside the buffer layer and a larger diameter of the bubbles. However, if the diameter of the bubble or the density of the bubbles inside the buffer layer is substantially small, the buffer layer may have a poor capacity to absorb external impact. If the diameter of the bubble or the density of the bubbles inside the buffer layer is substantially large, the buffer layer may be likely to collapse, and the stability may be poor. In one embodiment, the diameter of the bubble may be approximately 30-80 μm, the density of the bubbles inside the buffer layer may be approximately 50-100 bubbles/mm$^2$, and the stirring time may be approximately 5-30 minutes.

Further, the generated bubbles may have a uniform distribution inside the buffer layer, i.e., the generated bubbles may be uniformly distributed inside the buffer layer. In another embodiment, the generated bubbles may have a non-uniform distribution inside the buffer layer, i.e., the bubbles may be configured to have a predesigned distribution inside the buffer layer according to various preparing environment settings. For example, the bubbles may have a higher density near the surfaces of the buffer layer, while a lower density near the center region of the buffer layer or vice versa.

Because the buffer layer is disposed in the non-display region of the display panel and surrounding the display region of the display panel, the bubbles disposed inside the buffer layer may overall exhibit a frame shape. For example, if the buffer layer has a rectangular frame shape, the bubbles disposed inside the buffer layer may overall exhibit a rectangular frame shape accordingly, i.e., the overall shape of the bubbles may be a rectangular frame. If the buffer layer has a circular frame shape, the bubbles disposed inside the buffer layer may overall exhibit a circular frame shape or a ring shape accordingly, i.e., the overall shape of the bubbles may be a circular frame or a ring.

Further, the buffer layer may include various ingredients, such as a pre-polymer, acrylate monomers and photo-initiator. The buffer layer may also include other ingredients. According to various application scenarios, the pre-polymer and the photo-initiator may be selected. In one embodiment, the pre-polymer may be epoxy resin.

The concentration or the weight percentage of the various ingredients may also be determined according to various application scenarios. In one embodiment, the weight percentage of the pre-polymer, acrylate monomers and photo-initiator may be approximately 30-50%:40-60%:1-6%.

In another embodiment, to improve the blowing rate in the stirring process, the buffer layer may further include a suds booster, and the weight percentage of the pre-polymer, the acrylate monomers, the photo-initiator and the suds booster may be approximately 30-50%:40-60%:1-6%:0.1-0.5%.

In another embodiment, to improve the supporting stability of the buffer layer, the buffer layer may further include a thickening agent, and the weight percentage of the pre-polymer, the acrylate monomers, the photo-initiator and the thickening agent may be approximately 30-50%:40-60%:1-6%:0.1-0.3%.

In another embodiment, the buffer layer may include a pre-polymer, acrylate monomers, photo-initiator, a suds booster and a thickening agent. The weight percentage of a sum of the suds booster and the thickening agent, the pre-polymer, the acrylate monomers, and the photo-initiator, may be approximately 0.2-1%:30-50%:40-60%:1-6%. Further, the weight percentage of the suds booster and thickening agent may be set as 6:4.

Further, the buffer layer may have a single layer or a multi-layer structure. If the buffer layer has a multi-layer structure, the multiple layers may be made of different ingredients, and/or disposed with bubbles filled with different gases. For example, the buffer lay may have a first layer made of a pre-polymer, acrylate monomers and a photo-initiator, a second layer made of a pre-polymer, acrylate monomers, a photo-initiator and a thickening agent, and a third layer made of a pre-polymer, acrylate monomers, a photo-initiator, a suds booster and a thickening agent.

Figure 5:
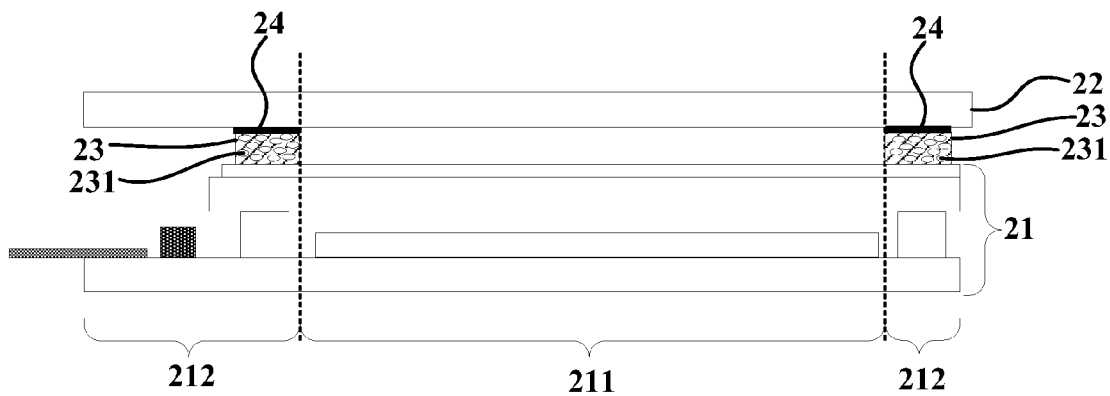
FIG. 5 illustrates a cross-sectional view of another exemplary display device consistent with disclosed embodiments.

FIG. 5 illustrates a cross-sectional view of another exemplary display device consistent with disclosed embodiments. The similarities between FIG. 5 and FIGS. 1a-1b are not repeated here, while certain difference may be explained. As shown in FIG. 5, the display device may include a display panel 21, a cover lens 22 and a buffer layer 23. In particular, the cover lens 22 may be disposed on a light-emitting surface of the display panel 21, for example, the surface facing viewers. The display panel 21 may include a display region 211 and a non-display region 212. The display region 211 may be in a center region of the display panel 21, the non-display region 212 may be in a border region of the display panel 21, and the non-display region 212 may surround the display region 211. Bubbles 231 may be disposed inside the buffer layer 23.

Further, a light-shielding layer 24 may be disposed at edges or borders of a surface of the cover lens 22 facing the display panel 21 (e.g., an inner surface of the cover lens 22), in which the edges of the surface of the cover lens 22 facing the display panel 21 may be corresponding to the non-display region 212 of the display panel 21. Along a direction perpendicular to the cover lens 22, the projection of the buffer layer 23 onto the cover lens 22 may be within the projection of the light-shielding layer 24 onto the cover lens 22. In certain embodiments, along the direction perpendicular to the cover lens 22, the projection of the buffer layer 23 onto the cover lens 22 may be exactly overlapped with the projection of the light-shielding layer 24 onto the cover lens 22.

In one embodiment, as shown in FIG. 5, along a direction perpendicular to the cover lens 22, the projection of the buffer layer 23 onto the cover lens 22 may be within the projection of the light-shielding layer 24 onto the cover lens 22. Thus, the buffer layer 23 may neither cause an increase in the area of the non-display region 212 of the display panel 21 nor degrade the light transmittance of the entire display panel.

It should be noted that, the disclosed display device may also include other components and circuits supporting the normal operation of the display device. The disclosed display device may be a tablet, a TV, a smartphone, a notebook, a digital frame, and a smartwatch, etc. Further, the display device may be any appropriate type of content-presentation devices.

Figure 6A:
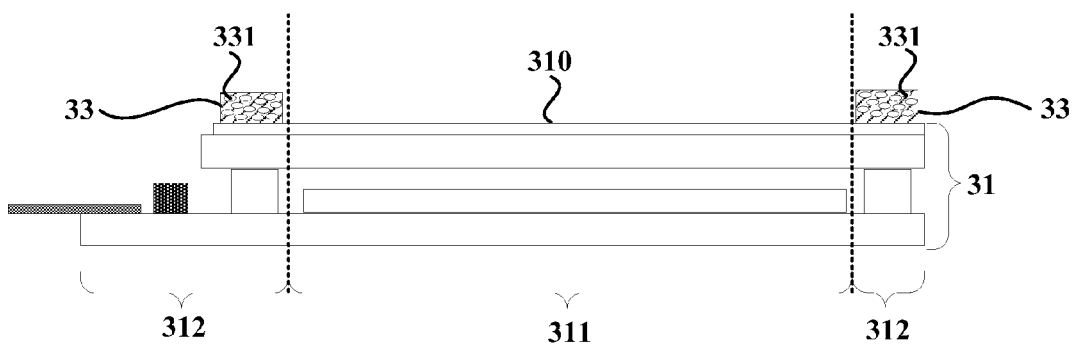
FIGS. 6a-6c illustrate cross-sectional views of an exemplary display device during certain stages of the packaging process in FIG. 7 consistent with disclosed embodiments.
Figure 6B:
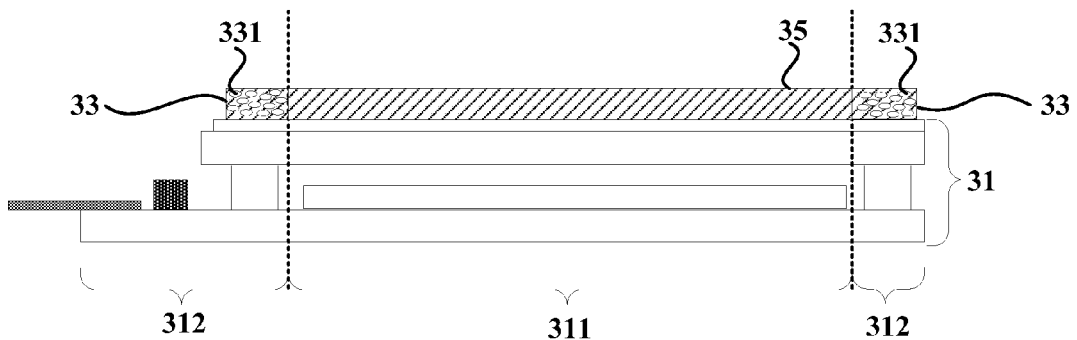
Figure 6C:
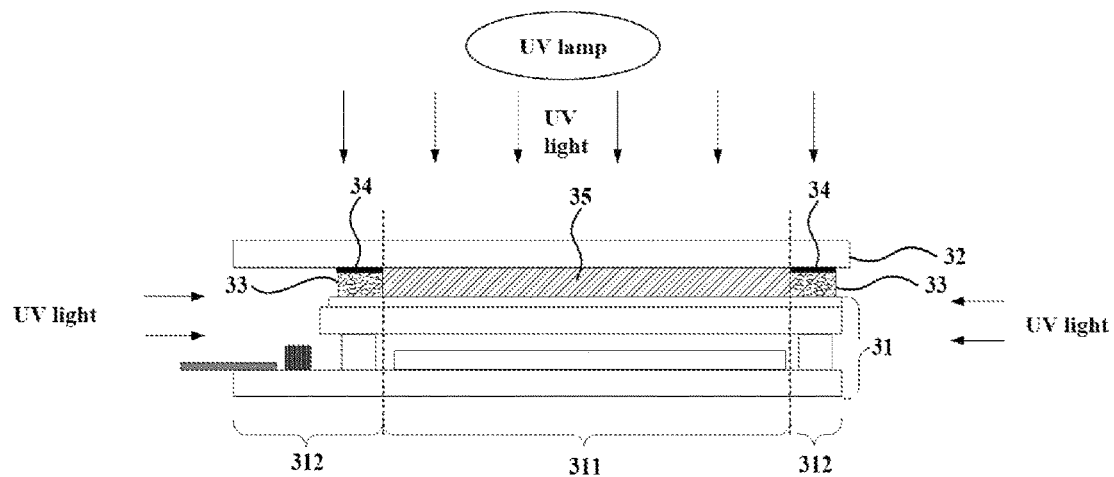
Figure 7:
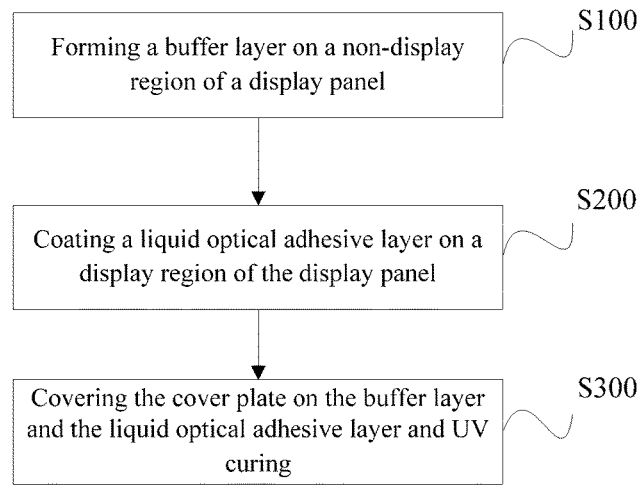
FIG. 7 illustrates a flow chart of an exemplary display device packaging process consistent with disclosed embodiments.

The present disclosure provides an improved packaging method of the display device. FIG. 7 illustrates a flow chart of an exemplary display device packaging process consistent with disclosed embodiments. FIGS. 6a-6c illustrate cross-sectional views of an exemplary display device during certain stages of the packaging process in FIG. 7 consistent with disclosed embodiments.

As shown in FIG. 7, at the beginning, a buffer layer is formed in a non-display region of a display panel (S100). The corresponding structure is shown in FIG. 6a. As shown in FIG. 6a, a polarizer 310 may be disposed on top of the display panel 31. The display panel 31 may include a display region 311 and a non-display region 312. For example, the display region 311 may be in a center region of the display panel 31, the non-display region 312 may be in a border region of the display panel 31, and the non-display region 312 may surround the display region 311.

A buffer layer 311 may be coated on the non-display region 312 of the display panel 31, and the buffer layer 311 may include a plurality of bubbles 331. The buffer layer 311 may be made of UV curable adhesive or liquid optically clear adhesive.

The UV curable adhesive or liquid optically clear adhesive may generate a substantially large number of bubbles after being stirred for about more than 10 minutes, as long as without any defoaming agent. As discussed above, longer stirring time may lead to a larger density of the bubbles inside the buffer layer and a larger diameter of the bubbles. In one embodiment, through controlling the stirring time, the diameter of the bubble may be controlled within approximately 30-80 um. In another embodiment, suds booster with weight percentage of 0.1-0.5% may also be added to generate a desired number of the bubbles inside the UV curable adhesive or liquid optically clear adhesive.

Return to FIG. 7, after the buffer layer is formed in the non-display region of the display panel, a liquid optically clear adhesive layer is coated on the display region of the display panel (S200). The corresponding structure is shown in FIG. 6b. As shown in FIG. 6b, after the buffer layer 33 is formed in the non-display region 312 of the display panel 31, a liquid optically clear adhesive layer 35 may be coated on the display region 311 of the display panel 31.

Because the liquid optically clear adhesive is a liquid adhesive, the liquid optically clear adhesive may overflow in the production process, and a defect rate may be approximately 23%. However, in the disclosed embodiments, due to the attraction among the bubbles 331 inside the buffer layer 33, the overflow of the liquid optically clear adhesive may be suppressed to some extent.

Return to FIG. 7, after the liquid optically clear adhesive layer is coated on the display region of the display panel, the cover lens is covered on the buffer layer and the liquid optically clear adhesive layer, and UV cured (S300). The corresponding structure is shown in FIG. 6c. As shown in FIG. 6c, the cover lens 32 may be placed on the buffer layer 33 and the liquid optically clear adhesive layer 35, and a light-shielding layer 34 may be disposed on the cover lens 32.

Then a UV curing process may be performed to the display device. In one embodiment, the display device may be UV cured in the top and the sides thereof under 365-395 nm UV light with 1500 mJ-2000 mJ energy. That is, the UV light may be incident at the top surface and the side surfaces of the display device.

In particular, the light-shielding layer 34 may be disposed at edges of a surface of the cover lens 32 facing the display panel 31 (e.g., an inner surface of the cover lens 32), in which the edges of the surface of the cover lens 32 facing the display panel 31 may be corresponding to the non-display region 312 of the display panel 31. Along a direction perpendicular to the cover lens 32, the projection of the buffer layer 33 onto the cover lens 32 may be within the projection of the light-shielding layer 34 onto the cover lens 32. In certain embodiments, along the direction perpendicular to the cover lens 32, the projection of the buffer layer 33 onto the cover lens 32 may be exactly overlapped with the projection of the light-shielding layer 34 onto the cover lens 32.

The disclosed packaging method may be applicable to any disclosed display devices. Because the buffer layer is disposed between the cover lens and the display panel and in the non-display region of the display panel, when subjected to an external force, the buffer layer filled with bubbles may be able to absorb external impact or vibration energy through a deformation, such as compression. On one hand, the entire display device may be protected, screen crack caused by the external force may be suppressed, and the shock resistance of the display device may be improved. On the other hand, due to the attraction among the bubbles inside the buffer layer, the overflow of the liquid optically clear adhesive may be suppressed. Accordingly, the reliability and image performance of the display device may also be improved.

Further, the buffer layer may be made of the UV curable adhesive or liquid optically clear adhesive (LOCA) with bubbles filled inside. The materials of the buffer layer may be the same as the materials used in the existing packaging process of the display panel. Thus, new materials may not be introduced to the existing packaging process to fabricate the buffer layer, and the complexity and the cost of the packaging process may be reduced accordingly.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display device, comprising:
   a display panel having a display region and a non-display region;
   a cover lens disposed on a light-emitting surface of the display panel; and
   a buffer layer disposed between the cover lens and the display panel, wherein the buffer layer is disposed in the non-display region of the display panel and surrounding the display region of the display panel, and wherein the buffer layer is selectively filled with a plurality of bubbles to enhance a buffering effect.

2. The display device according to claim 1, wherein the display panel further includes:
a first substrate;
a second substrate arranged opposite to the first substrate; and
a liquid crystal layer sandwiched between the first substrate and the second substrate.

3. The display device according to claim 1, wherein the display panel further includes:
a first electrode layer;
a second electrode layer; and
a light-emitting functional layer sandwiched between the first electrode layer and the second electrode layer.

4. The display device according to claim 3, wherein:
the display panel further includes a plurality of driving transistors arranged in a matrix;
the first electrode layer includes a plurality of first sub-electrodes arranged in a matrix, wherein each first sub-electrode is electrically connected to one driving transistor; and
the second electrode layer is a planar electrode.

5. The display device according to claim 3, wherein:
the first electrode layer includes a plurality of first sub-electrodes arranged in parallel; and
the second electrode layer includes a plurality of second sub-electrodes arranged in parallel,
wherein the first sub-electrodes intersect or cross the second sub-electrodes, and the first sub-electrodes are electrically insulated from the second sub-electrodes.

6. The display device according to claim 1, wherein:
the bubbles are filled with air, nitrogen or inert gas.

7. The display device according to claim 1, wherein:
the buffer layer is an ultraviolet (UV) curable adhesive or liquid optically clear adhesive.

8. The display device according to claim 7, wherein:
the UV curable adhesive or the liquid optically clear adhesive is stirred by approximately 5-30 mins to generate the bubbles.

9. The display device according to claim 1, wherein:
a diameter of the bubble is approximately 30-80 μm; and
a density of the bubbles is approximately 50-100 bubbles/mm$^2$.

10. The display device according to claim 1, wherein:
the buffer layer includes a pre-polymer, acrylate monomers and a photo-initiator.

11. The display device according to claim 10, wherein:
the pre-polymer is an epoxy resin.

12. The display device according to claim 10, wherein:
a weight percentage of the pre-polymer, the acrylate monomers and the photo-initiator is approximately 30-50%: 40-60%: 1-6%.

13. The display device according to claim 10, wherein:
the buffer layer further includes a suds booster; and
weight percentages of the pre-polymer, the acrylate monomers, the photo-initiator and the suds booster is approximately 30-50%: 40-60%: 1-6%: 0.1-0.5%.

14. The display device according to claim 10, wherein:
the buffer layer further includes a thickening agent; and
a weight percentage of the pre-polymer, the acrylate monomers, the photo-initiator and the thickening agent is approximately 30-50%: 40-60%: 1-6%: 0.1-0.3%.

15. The display device according to claim 10, wherein:
the buffer layer further includes a thickening agent and a suds booster; and
a weight percentage of a sum of the suds booster and the thickening agent, the pre-polymer, the acrylate monomers, and the photo-initiator is approximately 0.2-1%: 30-50%: 40-60%: 1-6%.

16. The display device according to claim 15, wherein:
a weight percentage of the suds booster and the thickening agent is approximately 6:4.

17. The display device according to claim 1, wherein:
a light-shielding layer is disposed at edges of a surface of the cover lens facing the display panel, wherein the edges of the surface of the cover lens facing the display panel is corresponding to the non-display region of the display panel; and
along a direction perpendicular to the cover lens, a projection of the buffer layer onto the cover lens is within a projection of the light-shielding layer onto the cover lens.

18. The display device according to claim 1, wherein:
the plurality of bubbles disposed inside the buffer layer overall exhibits a frame shape.

19. The display device according to claim 1, further including:
a liquid optically clear adhesive layer disposed on the display region of the display panel and configured to attach the cover lens to the display panel,
wherein the buffer layer disposed in the non-display region of the display panel surrounds the liquid optically clear adhesive layer.

20. A display device, comprising:
a display panel having a display region and a non-display region;
a cover lens disposed on a light-emitting surface of the display panel; and
a buffer layer disposed between the cover lens and the display panel,
wherein:
the buffer layer is disposed in the non-display region of the display panel and surrounding the display region of the display panel,
the buffer layer is filled with a plurality of bubbles to enhance a buffering effect,
a light-shielding layer is disposed at edges of a surface of the cover lens facing the display panel, wherein the edges of the surface of the cover lens facing the display panel is corresponding to the non-display region of the display panel, and
along a direction perpendicular to the cover lens, a projection of the buffer layer onto the cover lens is within a projection of the light-shielding layer onto the cover lens.

* * * * *